United States Patent
Kitsukawa et al.

(10) Patent No.: US 8,907,704 B2
(45) Date of Patent: Dec. 9, 2014

(54) FREQUENCY SYNTHESIZER

(71) Applicant: Mitsubishi Electric Corporation, Chiyoda-ku (JP)

(72) Inventors: Yusuke Kitsukawa, Chiyoda-ku (JP); Hideyuki Nakamizo, Chiyoda-ku (JP); Kenji Kawakami, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 13/966,588

(22) Filed: Aug. 14, 2013

(65) Prior Publication Data

US 2014/0062537 A1  Mar. 6, 2014

(30) Foreign Application Priority Data

Aug. 29, 2012 (JP) ................. 2012-188814

(51) Int. Cl.
| | | |
|---|---|---|
| H03B 21/00 | (2006.01) | |
| H03L 7/197 | (2006.01) | |
| H03L 7/087 | (2006.01) | |
| H03L 7/23 | (2006.01) | |

(52) U.S. Cl.
CPC .............. *H03L 7/1974* (2013.01); *H03L 7/087* (2013.01); *H03L 7/1976* (2013.01); *H03L 7/23* (2013.01)
USPC ............................ 327/107; 327/159; 327/150

(58) Field of Classification Search
USPC ......... 327/105–107, 355, 147–150, 156–159, 327/165, 166; 375/375, 376; 331/1 R, 2
See application file for complete search history.

(56) References Cited

U.S. PATENT DOCUMENTS

| | | | | |
|---|---|---|---|---|
| 4,630,217 A | * | 12/1986 | Smith et al. | 702/124 |
| 5,856,766 A | * | 1/1999 | Gillig et al. | 331/176 |
| 6,329,850 B1 | * | 12/2001 | Mair et al. | 327/107 |
| 6,734,739 B2 | * | 5/2004 | Kawahara | 331/25 |
| 8,004,324 B2 | * | 8/2011 | Tajima et al. | 327/156 |
| 2010/0171532 A1 | * | 7/2010 | Tajima et al. | 327/142 |

FOREIGN PATENT DOCUMENTS

| | | |
|---|---|---|
| JP | 7-87473 | 3/1995 |
| WO | WO 2007/091516 A1 | 8/2007 |

OTHER PUBLICATIONS

Kenichi Tajima, et al., "Frequency and Phase Difference Control Using Fractional-*N* PLL Synthesizers by Composition of Control Data", IEEE Transactions on Microwave Theory and Techniques, vol. 55, No. 12, Dec. 2007, 7 pages.

* cited by examiner

*Primary Examiner* — Lincoln Donovan
*Assistant Examiner* — Thomas Skibinski
(74) *Attorney, Agent, or Firm* — Oblon, Spivak, McClelland, Maier & Neustadt, L.L.P.

(57) ABSTRACT

Disclosed is a frequency synthesizer including first and second shift register circuits 3a and 3b each for outputting PLL setting data on a rising edge of a load enable signal, first and second fractional modulators 4a and 4b each for generating dividing number control data on the basis of the PLL setting data in synchronization with a reference signal, and first and second fractional PLL synthesizers 5a and 5b each for generating a high frequency signal according to the PLL setting data, the reference signal, and the dividing number control data. By controlling the timing of the load enable signal, the frequency synthesizer carries out phase control between the high frequency signals generated by the first and second fractional PLL synthesizers 5a and 5b.

4 Claims, 10 Drawing Sheets

FREQUENCY SYNTHESIZER

BACKGROUND OF THE INVENTION

1. Field of the Invention

The present invention relates to a frequency synthesizer for use in a radar, a radio communication device, and so on.

2. Description of Related Art

Conventionally, frequency synthesizers disclosed in, for example, patent reference 1 and nonpatent reference 1 are known. FIG. 11 is a block diagram showing an example of a conventional frequency synthesizer as shown in patent reference 1. The frequency synthesizer shown in the figure is provided with a reference oscillator 101 for generating a reference signal, a clock signal, data signal, and load enable signal generating circuit 102 for generating a clock signal, a data signal, and a load enable signal which are to be inputted to a shift register circuit 103, the shift register circuit 103 for outputting PLL setting data on the basis of the data signal, a fractional modulator 104 for generating dividing number control data, and a fractional PLL synthesizer 105 for generating a high frequency signal.

The clock signal, data signal, and load enable signal generating circuit 102 generate a clock signal (CLK), a data signal (DATA), and a load enable signal (LE). The clock signal, the data signal, and the load enable signal are typically signals having lower speeds than that of the reference signal.

The shift register circuit 103 captures the data signal having PLL setting information on a rising edge of the clock signal into a register thereof, and performs a process associated with the descriptions of the data in the register and outputs PLL setting data on a rising edge of the load enable signal.

The fractional modulator 104 generates dividing number control data according to the PLL setting data outputted from the shift register circuit 103. The fractional PLL synthesizer 105 generates a high frequency signal according to both the reference signal generated by the reference oscillator 101 and the dividing number control data generated by the fractional modulator 104.

Further, FIG. 12 is a block diagram showing an example of a conventional frequency synthesizer, as described in nonpatent reference 1, which performs a parallel operation. The frequency synthesizer shown in FIG. 12 includes a reference oscillator 201 for generating a reference signal, a frequency setting data generating circuit 202 for generating frequency setting data for the frequency synthesizer, a phase difference setting data generating circuit 203 for generating phase difference setting data for the frequency synthesizer, a control circuit 204 for generating dividing number control data, and fractional PLL synthesizers 205 and 206 each for generating a high frequency signal. The control circuit 204 is comprised of a reset signal control circuit 207 for generating a reset signal at a time according to the phase difference setting data, and fractional modulators 208 and 209 each for generating dividing number control data.

The control circuit 204 generates dividing number control data according to the frequency setting data and the phase difference setting data in synchronization with the reference signal generated by the reference oscillator 201. The dividing number control data are generated by the fractional modulators 208 and 209 after a reset signal generated by a reset signal control circuit 207 is inputted to the fractional modulators. The fractional PLL synthesizer 205 generates a high frequency signal according to the reference signal generated by the reference oscillator 201 and the dividing number control data outputted from the fractional modulator 208. Similarly, the fractional PLL synthesizer 206 generates a high frequency signal according to the reference signal generated by the reference oscillator 201 and the dividing number control data outputted from the fractional modulator 209. At this time, because the same frequency setting data is provided for the fractional modulators 208 and 209, the frequencies of the high frequency signals of the fractional PLL synthesizers 205 and 206 are the same as each other.

The dividing number control data has periodicity. When the per period average of a dividing number is expressed as Nave, the frequency f0 of the output of each of the fractional PLL synthesizers is given by the following equation.

$$f_0 = f_r \cdot N_{ave} = f_r \cdot \left(N_0 + \frac{K}{M}\right) \quad (1)$$

where $f_r$ is the frequency of the reference signal, $N_0$ is the integer part of $N_{ave}$, and K and M show the fractional part of $N_{ave}$.

When phase synchronization is established in each of the fractional PLL synthesizers, the time difference between the rising edge of the reference signal whose period is fixed and the rising edge of the output signal of each of the fractional PLL synthesizers has a value depending on the dividing number control data. At this time, in the control circuit 204, the reset signal control circuit 207 outputs the reset signal to the fractional modulators 208 and 209 at a time according to the phase difference setting data. By initializing the operation of each of the modulators by using the reset signal, the frequency synthesizer carries out a cyclic shift on the dividing number control data to cause a phase difference occur between the high frequency signals generated by the fractional PLL synthesizers 205 and 206.

At this time, the phase difference $\Delta\theta$ between the high frequency signals generated by the fractional PLL synthesizers 205 and 206 for 1 of shift amount of the dividing number control data is given by the following equation.

$$\Delta\theta = 2\pi \cdot \left(\frac{K}{M}\right) \quad (2)$$

As mentioned above, by initializing the operation of each of the modulators by using the reset signal according to the phase difference setting data, the frequency synthesizer carries out a cyclic shift on the dividing number control data to implement control of the phase difference between the high frequency signals generated by the fractional PLL synthesizers 205 and 206.

RELATED ART DOCUMENT

Patent Reference

Patent reference 1: Japanese Unexamined Patent Application Publication No. Hei 7-87473

Nonpatent Reference

Nonpatent reference 1: Kenichi Tajima, "Frequency and Phase Difference Control Using Fractional-N PLL Synthesizers by Composition of Control Data," IEEE Trans. on Microwave Theory and Techniques, Vol. 55, No. 12, December 2007

However, because the clock signal, the data signal, and the load enable signal have low speeds in the above-mentioned conventional frequency synthesizer, it is difficult for this conventional frequency synthesizer to carry out the phase difference control operating in synchronization with the reference signal and based on a cyclic shift on the dividing number control data. Further, the conventional frequency synthesizer that performs a parallel operation needs to receive the frequency setting data and the phase difference setting data from an outside of the frequency synthesizer, and this results in the structure becoming complicated.

SUMMARY OF THE INVENTION

The present invention is made in order to solve the above-mentioned problems, and it is therefore an object of the present invention to provide a frequency synthesizer that can implement control of the phase difference between high frequency signals generated by fractional PLL synthesizer operating in parallel with each other by using a simple structure.

In accordance with the present invention, there is provided a frequency synthesizer including: a reference oscillator for generating a reference signal; a plurality of clock signal, data signal, and load enable signal generating circuits each for generating a clock signal, a data signal, and a load enable signal in synchronization with the reference signal; a plurality of shift register circuits each for capturing the data signal on rising edges of the clock signal, and for outputting PLL setting data on a rising edge of the load enable signal; a plurality of fractional modulators each for generating dividing number control data on the basis of the PLL setting data in synchronization with the reference signal; and a plurality of fractional PLL synthesizers each for generating a high frequency signal according to the PLL setting data, the reference signal, and the dividing number control data, in which the frequency synthesizer controls timing of the load enable signals outputted from the plurality of clock signal, data signal, and load enable signal generating circuits to carry out phase control between the high frequency signals generated by the plurality of fractional PLL synthesizers.

Because the frequency synthesizer according to the present invention controls the timing of the load enable signals outputted from the plurality of clock signal, data signal, and load enable signal generating circuits to carry out phase control between the high frequency signals generated by the plurality of fractional PLL synthesizers, the frequency synthesizer can implement control of the phase difference between the high frequency signals generated by the fractional PLL synthesizers operating in parallel with each other by using a simple structure.

Further objects and advantages of the present invention will be apparent from the following description of the preferred embodiments of the invention as illustrated in the accompanying drawings.

DETAILED DESCRIPTION OF THE PREFERRED EMBODIMENTS

Embodiment 1

Figure 1:
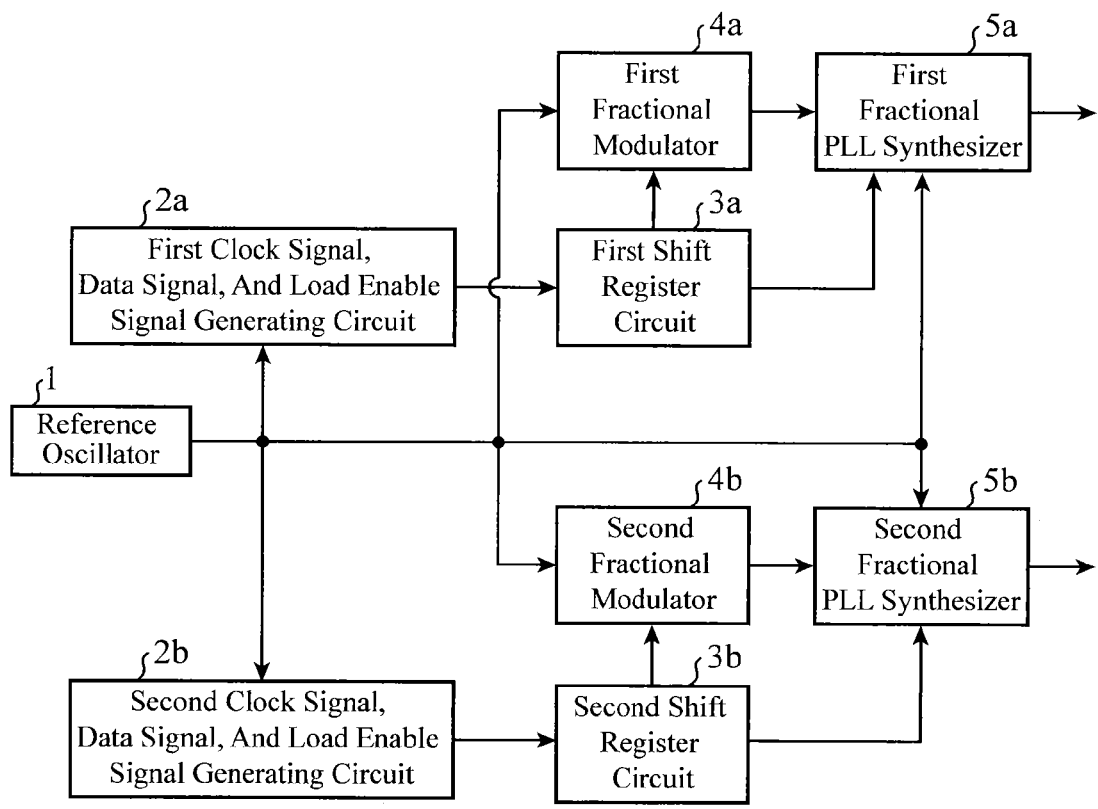
FIG. 1 is a block diagram showing a frequency synthesizer in accordance with Embodiment 1 of the present invention.

FIG. 1 is a block diagram showing a frequency synthesizer in accordance with Embodiment 1 of the present invention. The frequency synthesizer shown in FIG. 1 performs a parallel operation, and is comprised of a reference oscillator 1 for generating a reference signal, first and second clock signal, data signal, and load enable signal generating circuits 2a and 2b each for generating "a clock signal, a data signal, and a load enable signal," first and second shift register circuits 3a and 3b for outputting PLL setting data on the basis of the output signals of the first and second clock signal, data signal, and load enable signal generating circuits 2a and 2b respectively, first and second fractional modulators 4a and 4b for generating dividing number control data according to the PLL setting data from the first and second shift register circuits 3a and 3b respectively, and first and second fractional PLL synthesizers 5a and 5b for generating high frequency signals on the basis of the output signals from the first and second fractional modulators 4a and 4b respectively.

The reference oscillator 1 generates a reference signal. The first clock signal, data signal, and load enable signal generating circuit 2a generates a first clock signal (CLK1), a first data signal (DATA1), and a first load enable signal (LE1) in synchronization with the reference signal from the reference oscillator 1. Further, the second clock signal, data signal, and load enable signal generating circuit 2b generates a second clock signal (CLK2), a second data signal (DATA2), and a second load enable signal (LE2) in synchronization with the reference signal from the reference oscillator 1. The first data signal and the second data signal are the same as each other.

The first shift register circuit 3a outputs PLL setting data according to the first data signal. The second shift register circuit 3b outputs PLL setting data according to the second data signal.

The first fractional modulator 4a generates dividing number control data according to the PLL setting data outputted from the first shift register circuit 3a at a preset time in synchronization with the reference signal from the reference oscillator 1. Further, the second fractional modulator 4b generates dividing number control data according to the PLL setting data outputted from the second shift register circuit 3b at a preset time in synchronization with the reference signal from the reference oscillator 1.

The first fractional PLL synthesizer 5a generates a high frequency signal according to the PLL setting data outputted from the first shift register circuit 3a, the reference signal generated by the reference oscillator 1, and the dividing number control data generated by the first fractional modulator 4a. Further, the second fractional PLL synthesizer 5b generates a high frequency signal according to the PLL setting data outputted from the second shift register circuit 3b, the reference signal generated by the reference oscillator 1, and the dividing number control data generated by the second fractional modulator 4b.

At this time, because the first data signal and the second data signal are the same as each other, the same PLL setting data are provided for the first and second fractional modulators 4a and 4b. Therefore, the outputs of the first and second fractional PLL synthesizers 5a and 5b have the same frequency.

The dividing number control data has periodicity. When the per period average of a dividing number is expressed as Nave, the frequency f0 of the outputs of the first and second fractional PLL synthesizers 5a and 5b is given by equation (1). When phase synchronization is established in each of the first and second fractional PLL synthesizers 5a and 5b, the time difference between the rising edge of the reference signal whose period is fixed and the rising edge of the output signal of each of the first and second fractional PLL synthesizers 5a and 5b has a value depending on the dividing number control data.

Figure 2:
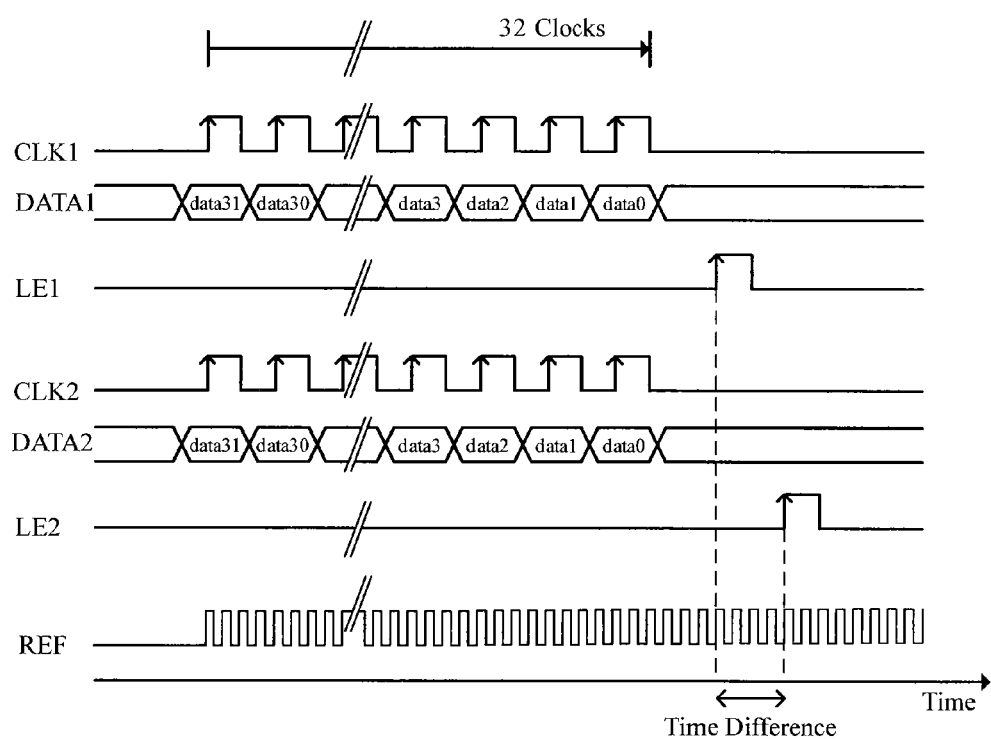
FIG. 2 is a timing chart of the frequency synthesizer in accordance with Embodiment 1 of the present invention.

FIG. 2 is a timing chart of the clock signals, the data signals, the load enable signals, and the reference signal in Embodiment 1. In the figure, CLK1, DATA1, and LE1 denote the first clock signal, the first DATA signal, and the first load enable signal respectively, and CLK2, DATA2, and LE2 denote the second clock signal, the second DATA signal, and the second load enable signal respectively. Further, REF denotes the reference signal. Although an example in which each DATA signal is a 32 bit one and the clock shift value is 4 will be described hereafter, the bit length of each DATA signal can be an arbitrary positive integer and the clock shift value can be an arbitrary positive integer.

Referring to FIG. 2, the frequency synthesizer generates CLK1, DATA1, and LE1 by using the first clock signal, data signal, and load enable signal generating circuit 2a, captures DATA1 having PLL setting information into a register on the rising edges of CLK1 by using the first shift register circuit 3a, performs a process associated with the descriptions of DATA in the register on the rising edge of LE1, and outputs PLL setting data in the shift register. Similarly, the frequency synthesizer generates CLK2, DATA2, and LE2 by using the second clock signal, data signal, and load enable signal generating circuit 2b, captures DATA2 having PLL setting information into a register on the rising edges of CLK2 by using the second shift register circuit 3b, performs a process associated with the descriptions of DATA in the register on the rising edge of LE2, and outputs PLL setting data in the shift register.

At this time, by providing a time difference equal to an integral multiple of the period of the reference frequency between the rising edges of LE1 and LE2 to shift the PLL setting data, the frequency synthesizer carries out a cyclic shift on the dividing number control data generated by each of the first and second fractional modulators 4a and 4b to cause a phase difference to occur between the high frequency signals generated by the first and second fractional PLL synthesizers 5a and 5b. The rising edges of LE1 and LE2 occur simultaneously in such a case that the first and second fractional PLL synthesizers 5a and 5b operate in phase with each other (the phase difference between them is 0).

Figure 3:
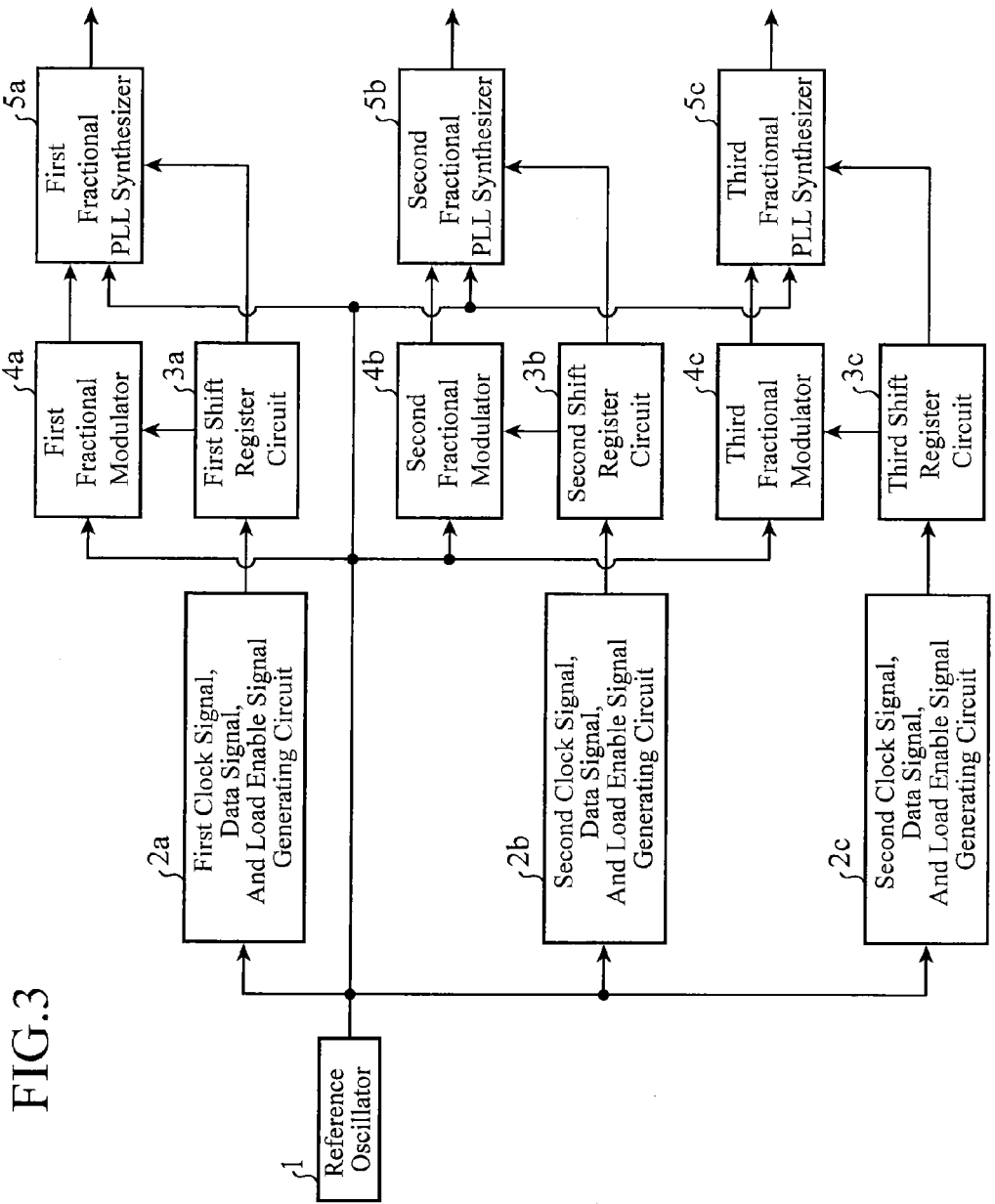
FIG. 3 is a block diagram showing an example of including three fractional PLL synthesizers in the frequency synthesizer in accordance with Embodiment 1 of the present invention.

Further, although the case in which the two fractional PLL synthesizers are disposed as the fractional PLL synthesizers operating in parallel with each other is shown in the above-mentioned example, the present embodiment is not limited to this case. The present embodiment can be applied similarly to even a case in which three or more fractional PLL synthesizers are disposed. FIG. 3 is a block diagram showing a case in which the number of fractional PLL synthesizers is three. In the figure, a first clock signal, data signal, and load enable signal generating circuit 2a, a first shift register circuit 3a, and a first fractional modulator 4a correspond to a first fractional PLL synthesizer 5a, and a second clock signal, data signal, and load enable signal generating circuit 2b, a second shift register circuit 3b, and a second fractional modulator 4b similarly correspond to a second fractional PLL synthesizer 5b. Further, a third clock signal, data signal, and load enable signal generating circuit 2c, a third shift register circuit 3c, and a third fractional modulator 4c correspond to a third fractional PLL synthesizer 5c. The present embodiment can also be applied to the case in which three or more fractional PLL synthesizers are disposed in this way, the same advantages as those provided by the above-mentioned example can be provided.

Further, in the frequency synthesizer, each of the PLL units, such as the one including the first shift register circuit 3a, the first fractional modulator 4a, and first fractional PLL synthesizer 5a, and the one including the second shift register circuit 3b, the second fractional modulator 4b, and second fractional PLL synthesizer 5b, is typically constructed of an IC. Therefore, in order to cause an arbitrary number of fractional PLL synthesizers to operate, what is necessary is just to use identical ICs (a shift register circuit, a fractional modulator, and a fractional PLL synthesizer) whose number is equal to the number of fractional PLL synthesizers, and hence a structure of providing three or more fractional PLL synthesizers can be easily implemented.

As previously explained, the frequency synthesizer according to Embodiment 1 includes the reference oscillator for generating a reference signal, the plurality of clock signal, data signal, and load enable signal generating circuits each for generating a clock signal, a data signal, and a load enable signal in synchronization with the reference signal, the plurality of shift register circuits each for capturing the data signal on rising edges of the clock signal, and for outputting PLL setting data on a rising edge of the load enable signal, the plurality of fractional modulators each for generating dividing number control data on the basis of the PLL setting data in synchronization with the reference signal, and the plurality of fractional PLL synthesizers each for generating a high frequency signal according to the PLL setting data, the reference signal, and the dividing number control data, in which the frequency synthesizer controls timing of the load enable signals outputted from the plurality of clock signal, data signal, and load enable signal generating circuits to carryout phase control between the high frequency signals generated by the plurality of fractional PLL synthesizers. Therefore, the frequency synthesizer can implement control of the phase difference between the high frequency signals generated by the fractional PLL synthesizers operating in parallel with each other by using a simple structure.

Embodiment 2

Figure 4:
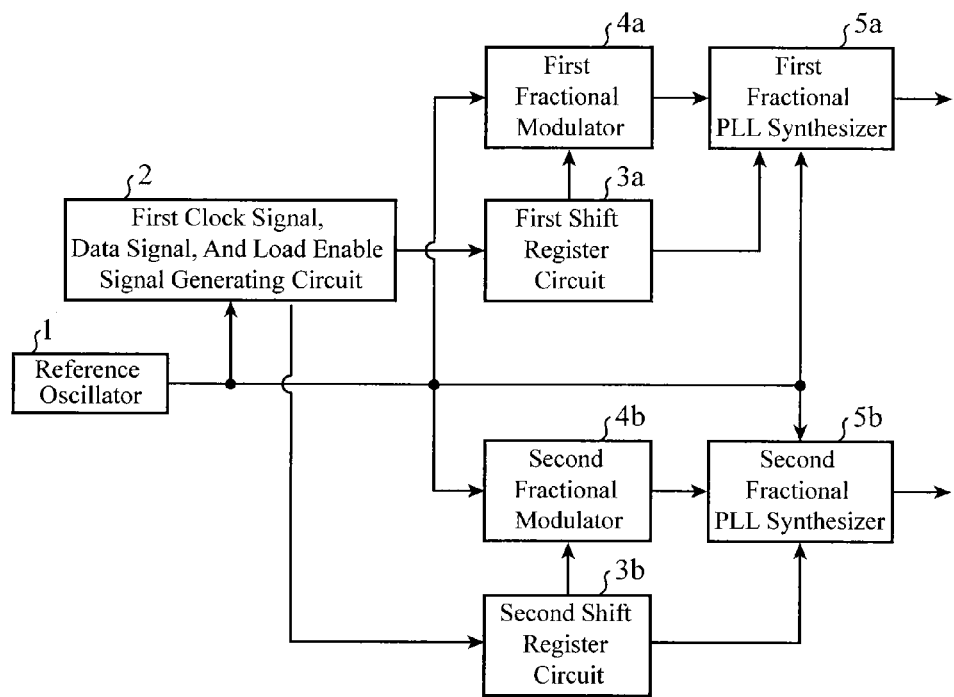
FIG. 4 is a block diagram showing a frequency synthesizer in accordance with Embodiment 2 of the present invention.

FIG. 4 is a block diagram showing a frequency synthesizer in accordance with Embodiment 2 of the present invention that performs a parallel operation. The frequency synthesizer shown in FIG. 4 is provided with a reference oscillator 1, a clock signal, data signal, and load enable signal generating circuit 2, first and second shift register circuits 3a and 3b, first and second fractional modulators 4a and 4b, and first and second fractional PLL synthesizers 5a and 5b. Because the structural components other than the clock signal, data signal, and load enable signal generating circuit 2 are the same as those according to Embodiment 1 shown in FIG. 1, the explanation of the structural components will be omitted hereafter.

In Embodiment 1, the two clock signal, data signal, and load enable signal generating circuits 2a and 2b are used to generate "clock signals, data signals, and load enable signals" provided for the first and second shift register circuits 3a and 3b. In contrast, in accordance with Embodiment 2, the shared clock signal, data signal, and load enable signal generating circuit 2 is used to generate "a clock signal, a data signal, and load enable signals."

The clock signal, data signal, and load enable signal generating circuit 2 provides a common clock signal (CLK) and a common data signal (DATA) for the first and second shift register circuits 3a and 3b in synchronization with the reference signal, and provides a load enable signal 1 (LE1) and a load enable signal 2 (LE2) for the first shift register circuit 3a and the second shift register circuit 3b respectively in synchronization with the reference signal.

Figure 5:
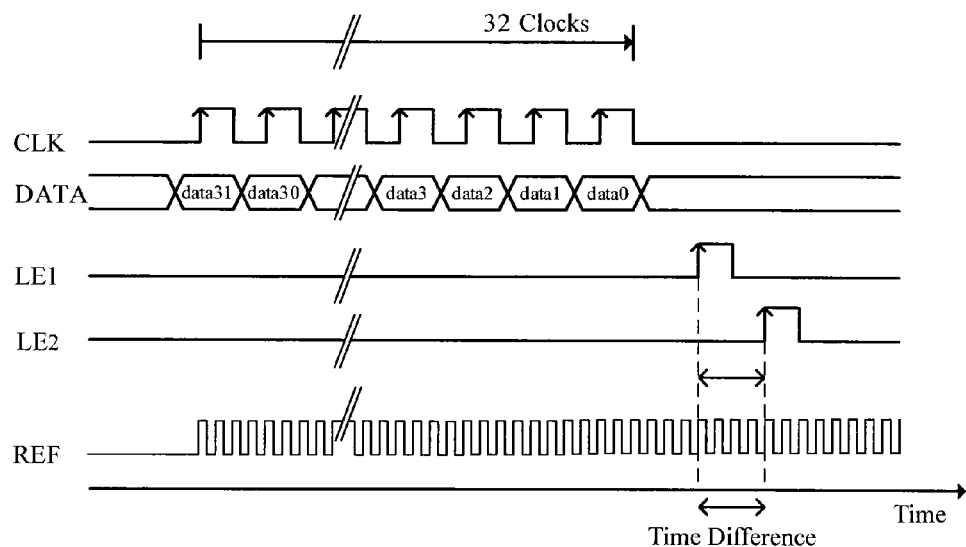
FIG. 5 is a timing chart of the frequency synthesizer in accordance with Embodiment 2 of the present invention.

An example of a timing chart in the case of using the common clock signal and the common data signal is shown in FIG. 5. Although an example in which the DATA signal is a 32 bit one and the clock shift value is 4 will be described hereafter, the bit length of the DATA signal can be an arbitrary positive integer and the clock shift value can be an arbitrary positive integer.

Referring to FIG. 4, the frequency synthesizer generates the clock signal (CLK), the data signal (DATA), the first load enable signal (LE1), and the second load enable signal (LE2) by using the clock signal, data signal, and load enable signal generating circuit 2. The frequency synthesizer captures the data signal having PLL setting information into a register on the rising edges of the clock signal by using the first shift register circuit 3a, and performs a process associated with the descriptions of the data in the register on the rising edge of the first load enable signal (LE1) to output PLL setting data in the shift register. The frequency synthesizer also captures the data signal having PLL setting information into a register on the rising edges of the clock signal by using the second shift register circuit 3b, and performs a process associated with the descriptions of the data in the register on the rising edge of the second load enable signal (LE2) to output PLL setting data in the shift register.

At this time, by providing a time difference equal to an integral multiple of the period of the reference frequency between the rising edges of LE1 and LE2 to shift the PLL setting data, the frequency synthesizer carries out a cyclic shift on dividing number control data generated by each of the first and second fractional modulators 4a and 4b to cause a phase difference to occur between high frequency signals generated by the first and second fractional PLL synthesizers 5a and 5b.

Also in Embodiment 2, even in a case in which the number of fractional PLL synthesizers operating in parallel with one another are three or more, the same advantages are provided. Further, the clock signal, data signal, and load enable signal generating circuit 2 can be shared by the fractional PLL synthesizers.

As previously explained, because the plurality of clock signals are made to be identical to each other and the plurality of data signals are made to be identical to each other in the frequency synthesizer according to Embodiment 2, the same advantages as those provided by Embodiment 1 can be provided while the structure of the frequency synthesizer can be simplified.

Embodiment 3

Figure 6:
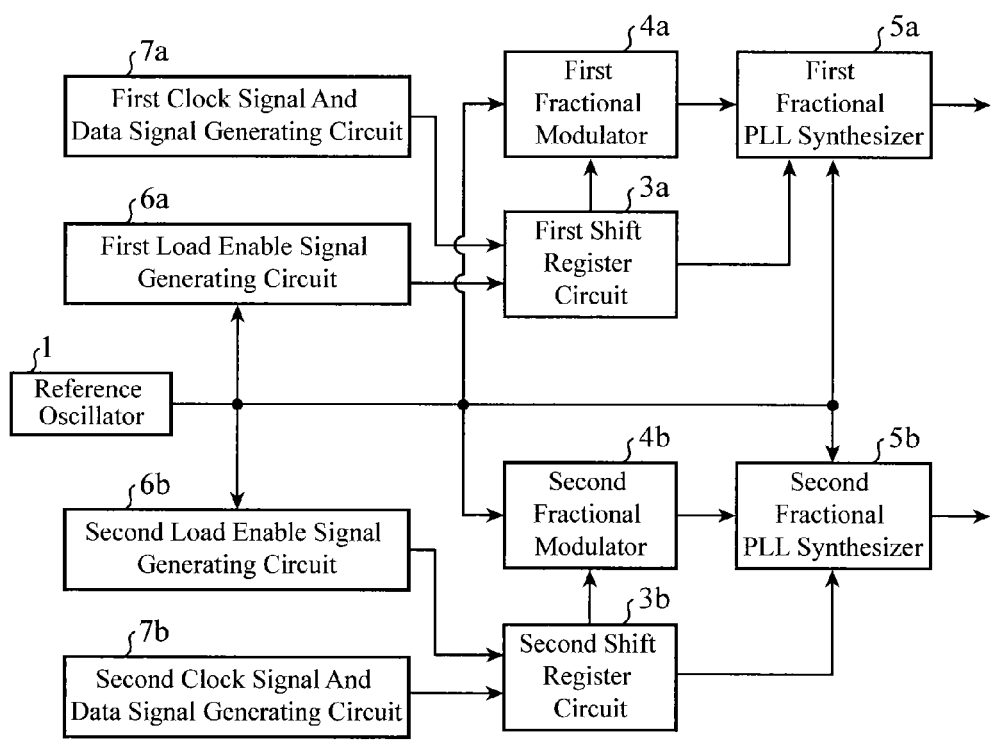
FIG. 6 is a block diagram showing a frequency synthesizer in accordance with Embodiment 3 of the present invention.

FIG. 6 is a block diagram showing a frequency synthesizer in accordance with Embodiment 3 of the present invention that performs a parallel operation. The frequency synthesizer shown in FIG. 6 is provided with a reference oscillator 1, first and second shift register circuits 3a and 3b, first and second fractional modulators 4a and 4b, first and second fractional PLL synthesizers 5a and 5b, first and second load enable signal generating circuits 6a and 6b, and first and second clock signal and data signal generating circuits 7a and 7b. Because structural components other than the first and second load enable signal generating circuits 6a and 6b and the first and second clock signal and data signal generating circuit 7a and 7b are the same as those according to Embodiment 1 shown in FIG. 1, the explanation of the structural components will be omitted hereafter.

In Embodiment 1, the case in which the first and second clock signal, data signal, and load enable signal generating circuit 2a and 2b each of which synchronizes with a reference signal are used is explained. In contrast, the frequency synthesizer in accordance with Embodiment 3 uses the first and second load enable signal generating circuits 6a and 6b each of which synchronizes with a reference signal, and the first and second clock signal and data signal generating circuits 7a and 7b each of which operates independently of the synchronization with the reference signal. The first load enable signal generating circuit 6a generates a load enable signal 1 (LE1) in synchronization with the reference signal from the reference oscillator 1. The second load enable signal generating circuit 6b generates a load enable signal 2 (LE2) in synchronization with the reference signal from the reference oscillator 1. The first clock signal and data signal generating circuit 7a generates a first clock signal (CLK1) and a first data signal (DATA1). The second clock signal and data signal generating circuit 7b generates a second clock signal (CLK2) and a second data signal (DATA2). In this case, DATA1 and DATA2 are the same as each other. At this time, each of the first and second clock signal and data signal generating circuits 7a and 7b does not have to carry out control of CLK1 and CLK2 and DATA 1 and DATA 2 in synchronization with the reference signal.

The frequency synthesizer captures DATA1 having PLL setting information into a register on the rising edges of CLK1 by using the first shift register circuit 3a, and performs a process associated with the descriptions of DATA in the register on the rising edge of LE1 to output PLL setting data. The frequency synthesizer also captures DATA2 having PLL setting information into a register on the rising edges of CLK2 by using the second shift register circuit 3b, and performs a process associated with the descriptions of DATA in the register on the rising edge of LE2 to output PLL setting data. At this time, by providing a time difference equal to an integral multiple of the period of the reference frequency between the rising edges of LE1 and LE2 to shift the PLL setting data, the frequency synthesizer carries out a cyclic shift on dividing number control data generated by each of the first and second fractional modulators 4a and 4b to cause a phase difference to occur between high frequency signals generated by the first and second fractional PLL synthesizers 5a and 5b.

Also in Embodiment 3, even in a case in which the number of fractional PLL synthesizers operating in parallel with one another are three or more, the same advantages are provided.

As previously explained, the frequency synthesizer in accordance with Embodiment 3 includes the reference oscillator for generating a reference signal, the plurality of clock signal and data signal generating circuits each for generating a clock signal and a data signal, the plurality of load enable signal generating circuits each for generating a load enable signal in synchronization with the reference signal, the plurality of shift register circuits each for capturing the data signal on rising edges of the clock signal, and for outputting PLL setting data on a rising edge of the load enable signal, the plurality of fractional modulators each for generating dividing number control data on the basis of the PLL setting data in synchronization with the reference signal, and the plurality of fractional PLL synthesizers each for generating a high frequency signal according to the PLL setting data, the reference signal, and the dividing number control data, in which the frequency synthesizer controls timing of the load enable signals outputted from the plurality of clock signal, data signal, and load enable signal generating circuits to carry out phase control between the high frequency signals generated by the plurality of fractional PLL synthesizers. Therefore, the frequency synthesizer can implement control of the phase difference between the high frequency signals generated by the fractional PLL synthesizers operating in parallel with each other by using a simple structure.

Embodiment 4

Figure 7:
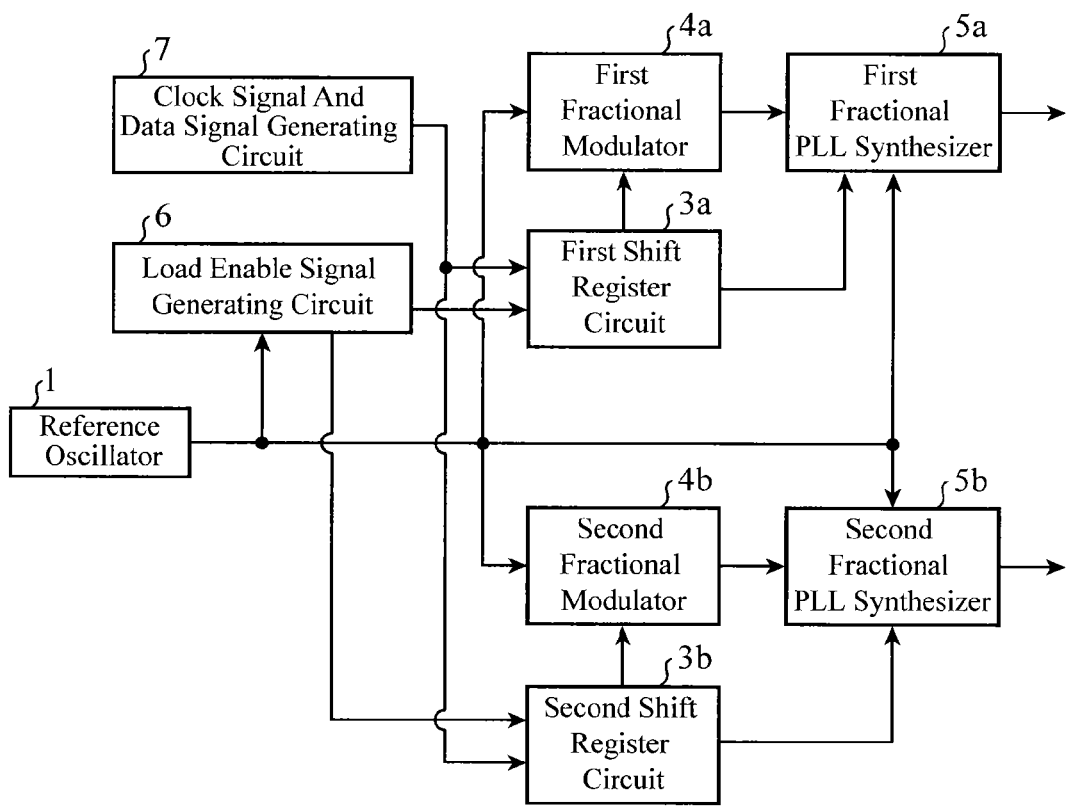
FIG. 7 is a block diagram showing a frequency synthesizer in accordance with Embodiment 4 of the present invention.

FIG. 7 is a block diagram showing a frequency synthesizer in accordance with Embodiment 4 of the present invention that performs a parallel operation. The frequency synthesizer shown in FIG. 7 is provided with a reference oscillator 1, first and second shift register circuits 3a and 3b, first and second fractional modulators 4a and 4b, first and second fractional PLL synthesizers 5a and 5b, a load enable signal generating circuit 6, and a clock signal and data signal generating circuit 7. Because structural components other than the load enable signal generating circuit 6 and the clock signal and data signal generating circuit 7 being disposed as shared circuits are the same as those according to Embodiment 3, the explanation of the structural components will be omitted hereafter.

In Embodiment 3, "clock signals, data signals and load enable signals" which are respectively provided to the first and second shift register circuits 3a and 3b are generated by using the separately-disposed first and second load enable signal generating circuits 6a and 6b, and the separately-disposed first and second clock signal and data signal generating circuits 7a and 7b. In contrast, in Embodiment 4, "a clock signal, a data signal, and load enable signals" are generated by using the shared load enable signal generating circuit 6 and the shared clock signal and data signal generating circuit 7.

The load enable signal generating circuit 6 provides a first load enable signal (LE1) for the first shift register circuit 3a in synchronization with a reference signal, and also provides a second load enable signal (LE2) for the second shift register circuit 3b in synchronization with the reference signal. The clock signal and data signal generating circuit 7 provides a common clock signal (CLK) and a common data signal (DATA) for the first and second shift register circuits 3a and 3b. As a result, the frequency synthesizer captures DATA having PLL setting information into a register on the rising edges of CLK by using the first shift register circuit 3a, and performs a process associated with the descriptions of DATA in the register on the rising edge of LE1 to output PLL setting data in the register. Further, the frequency synthesizer also captures DATA having PLL setting information into a register on the rising edges of CLK by using the second shift register circuit 3b, and performs a process associated with the descriptions of DATA in the register on the rising edge of LE2 to output PLL setting data in the register.

At this time, by providing a time difference equal to an integral multiple of the period of the reference frequency between the rising edges of LE1 and LE2 to shift the PLL setting data, the frequency synthesizer carries out a cyclic shift on dividing number control data generated by each of the first and second fractional modulators 4a and 4b to cause a phase difference to occur between high frequency signals generated by the first and second fractional PLL synthesizers 5a and 5b.

Also in Embodiment 4, even in a case in which the number of fractional PLL synthesizers operating in parallel with one another are three or more, the same advantages are provided.

As previously explained, because the plurality of clock signals are made to be identical to each other and the plurality of data signals are made to be identical to each other in the frequency synthesizer according to Embodiment 4, the same advantages as those provided by Embodiment 3 can be provided while the structure of the frequency synthesizer can be simplified.

Embodiment 5

Figure 8:
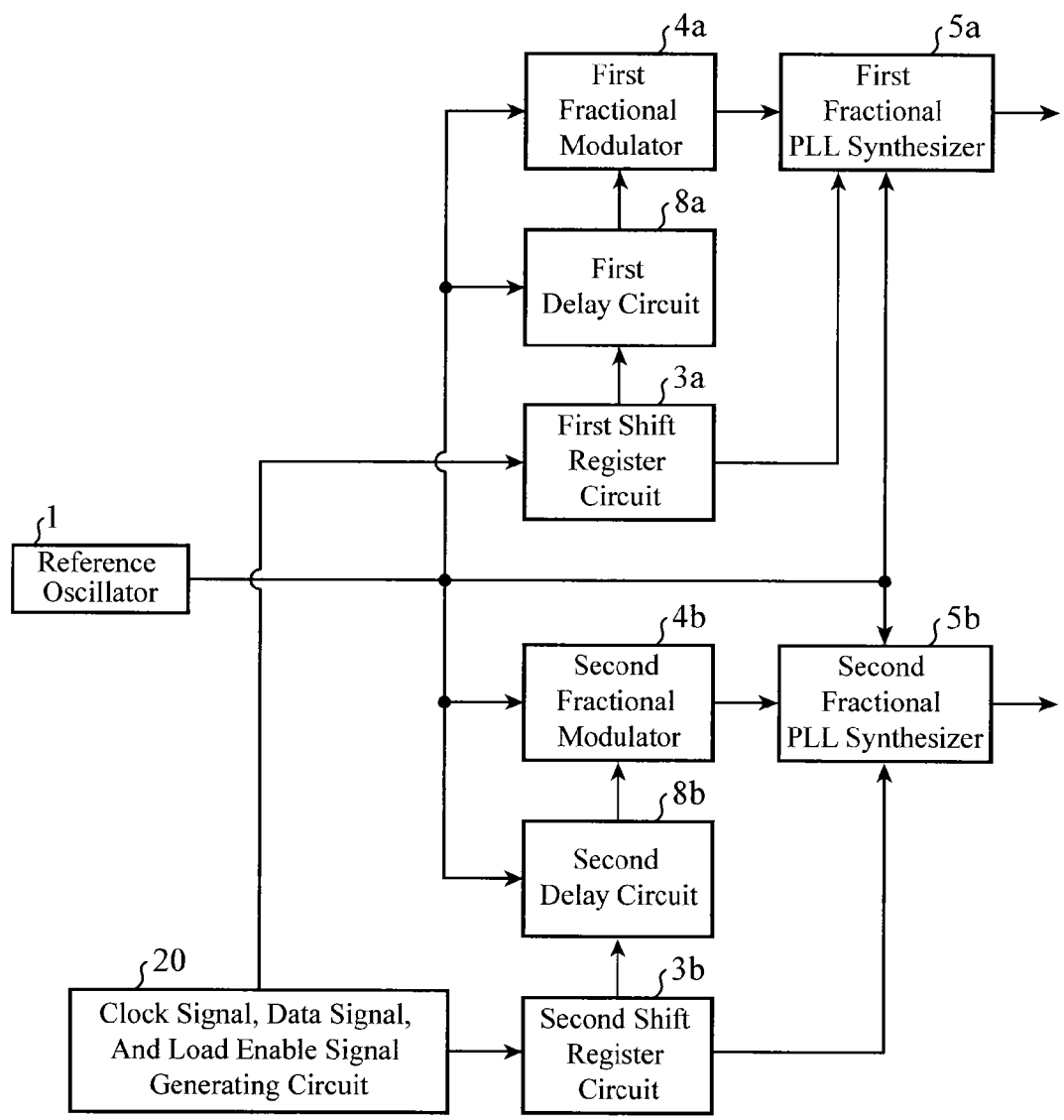
FIG. 8 is a block diagram showing a frequency synthesizer in accordance with Embodiment 5 of the present invention.

FIG. 8 is a block diagram showing a frequency synthesizer in accordance with Embodiment 5 of the present invention that performs a parallel operation. The frequency synthesizer shown in FIG. 8 is provided with a reference oscillator 1, a clock signal, data signal, and load enable signal generating circuit 20, first and second shift register circuits 3a and 3b, first and second fractional modulators 4a and 4b, first and second fractional PLL synthesizers 5a and 5b, and first and second delay circuits 8a and 8b. Because the basic structure of the frequency synthesizer other than the clock signal, data signal, and load enable signal generating circuit 20 and the first and second delay circuits 8a and 8b is the same as that according to Embodiment 2, the explanation of the basic structure will be omitted hereafter.

In Embodiment 2, the case in which a time difference equal to an integral multiple of the period of the reference frequency is provided between the rising edge of LE1 provided for the first shift register circuit 3a and that of LE2 provided for the second shift register circuit 3b to shift the PLL setting data is described. The frequency synthesizer in accordance with this Embodiment 5 shares an LE signal provided for the first and second shift register circuits 3a and 3b between these shift register circuits and provides different delays for outputs of the first and second shift register circuits by using the first and the second delay circuits 8a and 8b to shift PLL setting data.

The clock signal, data signal, and load enable signal generating circuit 20 provides a common clock signal (CLK) and a common load enable signal (LE) for the first and second shift register circuits 3a and 3b, and also provides a first data signal (DATA1) for the first shift register circuit 3a while providing a second data signal (DATA2) for the second shift register circuit 3b. The clock signal, data signal, and load enable signal generating circuit 20 can operate in synchronization with a reference signal or not.

The frequency synthesizer captures DATA1 having PLL setting information into a register on the rising edges of CLK by using the first shift register circuit 3a, and performs a process associated with the descriptions of DATA in the register on the rising edge of LE to output PLL setting data.

Delay information on the delay provided for the first delay circuit 8a is included in the PLL setting information of DATA1. Further, the frequency synthesizer captures DATA2 having PLL setting information into a register on the rising edges of CLK by using the second shift register circuit 3b, and performs a process associated with the descriptions of DATA in the register on the rising edge of LE to output PLL setting data. Delay information on the delay provided for the second delay circuit 8b is included in the PLL setting information of DATA2.

The first delay circuit 8a provides a delay equal to an integral multiple of the period of the reference signal for the PLL setting data outputted from the first shift register circuit 3a according to DATA1 in synchronization with the reference signal, and outputs the delayed PLL setting data to the first fractional modulator 4a. The second delay circuit 8b provides a delay equal to an integral multiple of the period of the reference signal for the PLL setting data outputted from the second shift register circuit 3b according to DATA2 in synchronization with the reference signal, and outputs the delayed PLL setting data to the second fractional modulator 4b.

At this time, by respectively providing the pieces of delay information for the first and second delay circuits 8a and 8b to shift the PLL setting data, the frequency synthesizer carries out a shift on dividing number control data generated by each of the first and second fractional modulators 4a and 4b to cause a phase difference to occur between high frequency signals generated by the first and second fractional PLL synthesizers 5a and 5b.

Figure 9:
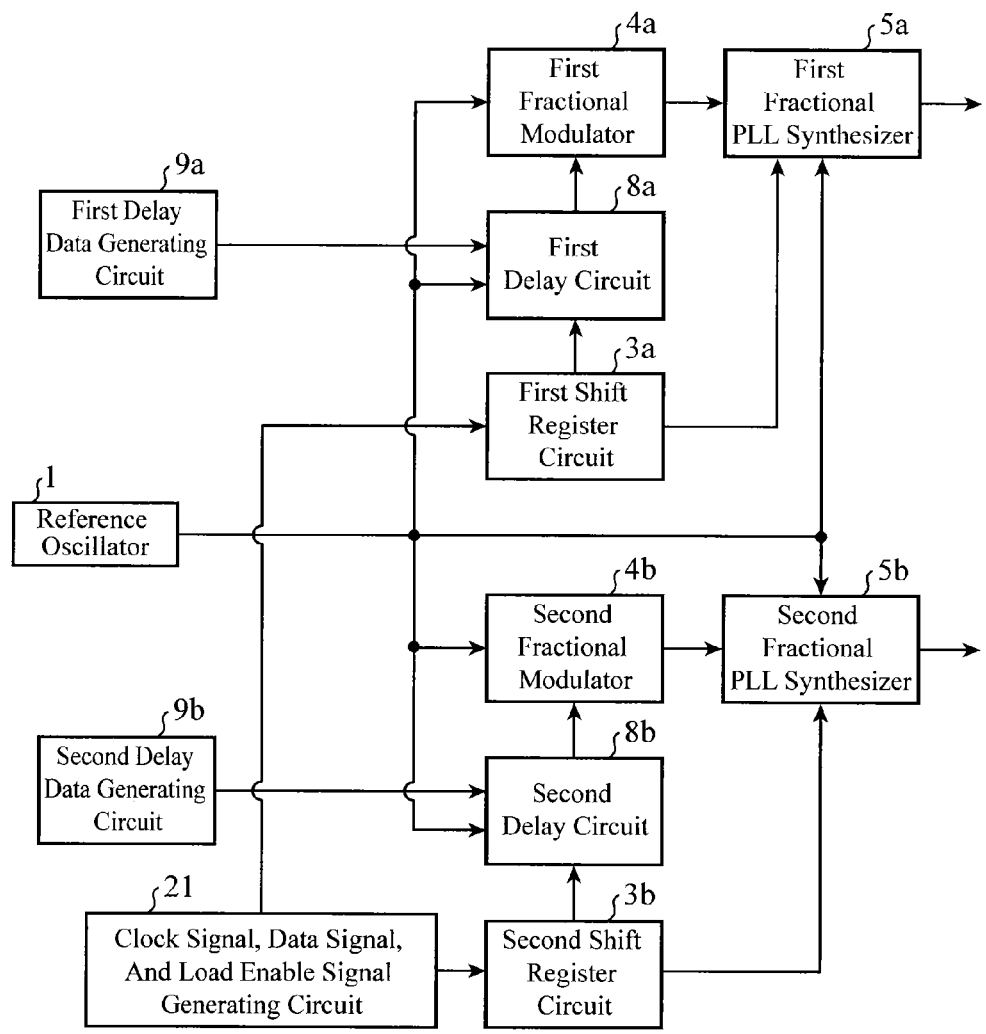
FIG. 9 is a block diagram showing another example of the frequency synthesizer in accordance with Embodiment 5 of the present invention.

Further, although the pieces of delay information provided for the first and second delay circuits 8a and 8b are respectively inputted into the data signals in the above-mentioned example, these pieces of delay information can be provided alternatively from an outside of the device, and this example will be explained below. FIG. 9 is a block diagram showing the example in which the pieces of delay information provided for the first and second delay circuits 8a and 8b are provided from an outside of the device. In the figure, structural components other than a clock signal, data signal, and load enable signal generating circuit 21 and first and second delay data generating circuit 9a and 9b are the same as those shown in FIG. 7. Although the clock signal, data signal, and load enable signal generating circuit 21 has the same basic structure as the clock signal, data signal, and load enable signal generating circuit 20, the clock signal, data signal, and load enable signal generating circuit 21 is constructed in such a way as to provide a common data signal (DATA) for the first and second shift register circuits 3a and 3b. Further, the first and second delay data generating circuits 9a and 9b provide the pieces of delay information for the first and second delay circuits 8a and 8b respectively.

Also in the frequency synthesizer constructed in this way, the pieces of delay information each showing a delay equal to an integral multiple of the period of the reference signal are respectively provided for the first and second delay circuits 8a and 8b by using first and the second delay amount data generating circuits 9a and 9b, so that the same advantages as those provided by the frequency synthesizer shown in FIG. 8 are provided.

The pieces of delay information respectively provided for the first and second delay circuits 8a and 8b are the same as each other in such a case that the first and second fractional PLL synthesizers 5a and 5b operate in phase with each other (the phase difference between them is 0). Also in Embodiment 5, even in a case in which the number of fractional PLL synthesizers operating in parallel with one another are three or more, the same advantages are provided. In this case, a number of delay circuits and a number of delay data generating circuits are disposed according to the number of fractional PLL synthesizers.

As previously explained, the frequency synthesizer according to Embodiment 5 includes the reference oscillator for generating a reference signal, the clock signal, data signal, and load enable signal generating circuit for generating a clock signal, a data signal, and a load enable signal in synchronization with the reference signal, the plurality of shift register circuits each for capturing the data signal on rising edges of the clock signal, and for outputting PLL setting data on a rising edge of the load enable signal, the plurality of delay circuits each for providing a delay for the PLL setting data in synchronization with the reference signal, the plurality of fractional modulators for generating dividing number control data on the basis of the PLL setting data outputted from the plurality of delay circuits respectively in synchronization with the reference signal, and the plurality of fractional PLL synthesizers for generating high frequency signals according to the PLL setting data outputted from the plurality of shift register circuits, the reference signal, and the dividing number control data respectively, in which the frequency synthesizer controls the delays provided by the plurality of delay circuits to carry out phase control between the high frequency signals generated by the plurality of fractional PLL synthesizers. Therefore, the frequency synthesizer can implement control of the phase difference between the high frequency signals generated by the fractional PLL synthesizers operating in parallel with each other by using a simple structure.

Embodiment 6

Figure 10:
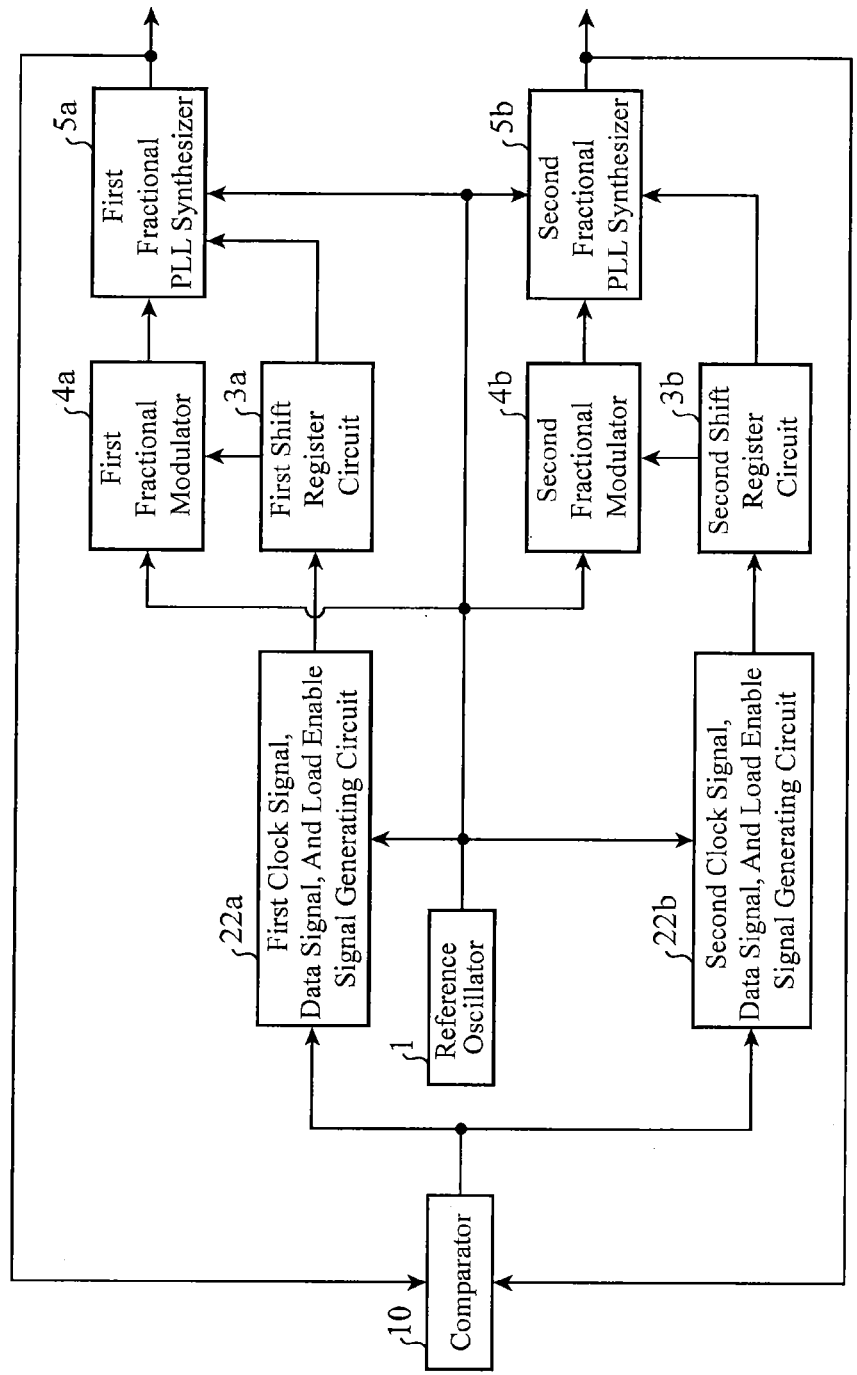
FIG. 10 is a block diagram showing a frequency synthesizer in accordance with Embodiment 6 of the present invention.
Figure 11:
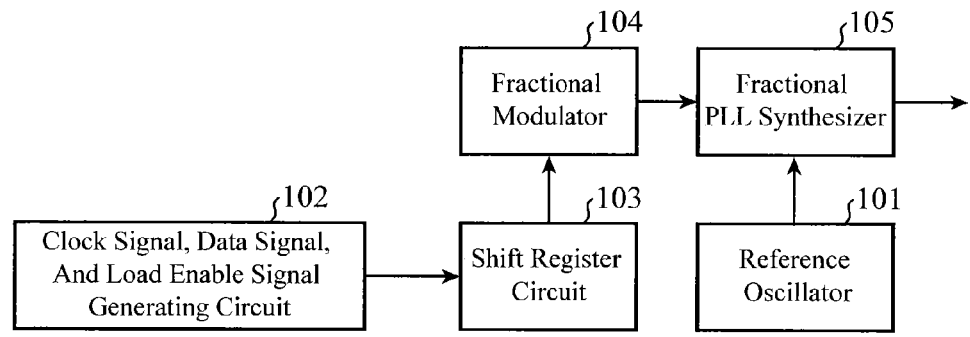
FIG. 11 is a block diagram showing a conventional frequency synthesizer.
Figure 12:
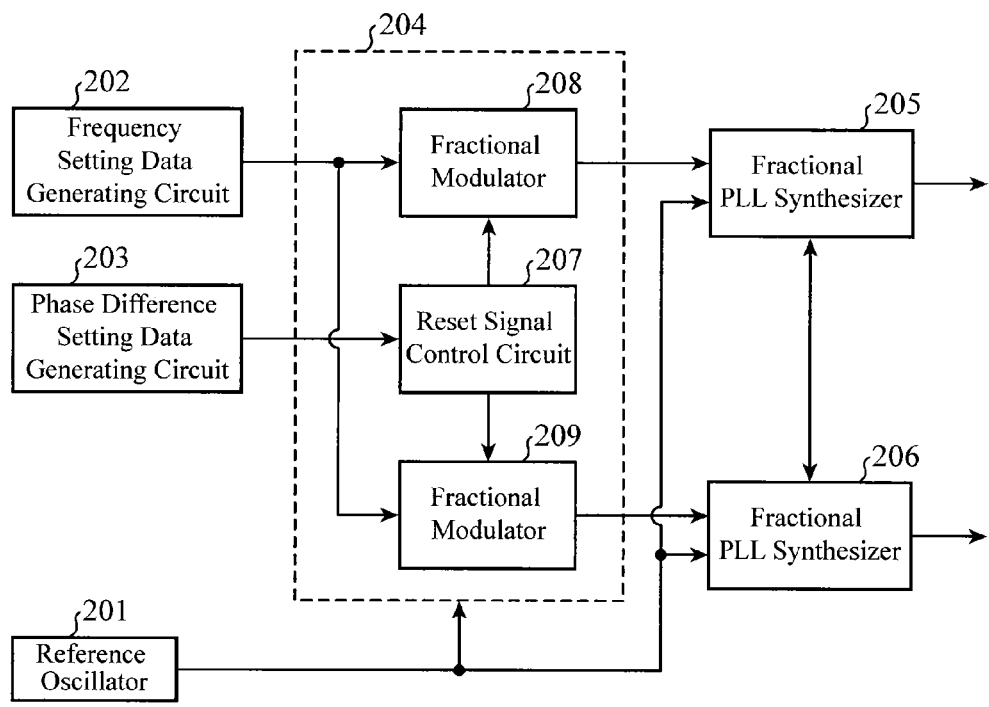
FIG. 12 is a block diagram showing another example of the conventional frequency synthesizer.

FIG. 10 is a block diagram showing a frequency synthesizer in accordance with Embodiment 6 of the present invention that performs a parallel operation. The frequency synthesizer shown in FIG. 10 is provided with a reference oscillator 1, first and second clock signal, data signal, and load enable signal generating circuits 22a and 22b, first and second shift register circuits 3a and 3b, first and second fractional modulators 4a and 4b, first and fractional PLL synthesizers 5a and 5b, and a comparator 10. Because structural components other than the first and second clock signal, data signal, and load enable signal generating circuits 22a and 22b and the comparator 10 are the same as those according to Embodiment 1 shown in FIG. 1, the explanation of the structural components will be omitted hereafter.

The comparator 10 is a circuit for comparing signals generated by the first and second fractional PLL synthesizers 5a and 5b with each other, and for outputting correction data to the first and second clock signal, data signal, and load enable signal generating circuits 22a and 22b. Further, while the first and second clock signal, data signal, and load enable signal generating circuits 22a and 22b have the same basic structure as the first and second clock signal, data signal, and load enable signal generating circuits 2a and 2b, the first and second clock signal, data signal, and load enable signal generating circuits 22a and 22b differ from the first and second clock signal, data signal, and load enable signal generating circuits 2a and 2b in that each of the first and second clock signal, data signal, and load enable signal generating circuits 22a and 22b corrects a data signal and a load enable signal generated thereby on the basis of the correction data from the comparator 10.

Next, the operation of the frequency synthesizer according to Embodiment 6 will be explained. The comparator 10 receives parts of high frequency signals respectively generated by the first and second fractional PLL synthesizers 5a and 5b, and outputs correction data for adjusting the phase of each of the high frequency signals according to the signals compared with each other to each of the first and second clock signal, data signal, and load enable signal generating circuits 22a and 22b. Each of the first and second clock signal, data signal, and load enable signal generating circuits 22a and 22b generates "a data signal and a load enable signal" according to the correction data inputted thereto, thereby being able to provide a desired phase difference between the high frequency signals generated by the first and second fractional PLL synthesizers 5a and 5b with a high degree of precision.

Although the case of applying this embodiment to Embodiment 1 is explained in Embodiment 6, the same advantages are provided even in a case of applying this embodiment to any one of Embodiments 2 to 4. Further, the frequency synthesizer in accordance with Embodiment 5 is constructed in such a way that the correction data acquired by the comparator 10 is outputted to the clock signal, data signal, and load enable signal generating circuit 20 or the first and second delay amount data generating circuits 9a and 9b. In this case, the same advantages are provided.

As previously explained, the frequency synthesizer according to Embodiment 6 includes the comparator for comparing the high frequency signals outputted from the plurality of fractional PLL synthesizers with each other to generate correction data for adjusting the phases of the high frequency signals according to the signals compared with each other, and the frequency synthesizer generates the data signals and the load enable signals according to the correction data. Therefore, in addition to the advantages provided by Embodiment 1, there is provided a further advantage of being able to provide a desired phase difference with a high degree of precision.

Further, the frequency synthesizer according to Embodiment 6 includes the comparator for comparing the high frequency signals outputted from the plurality of fractional PLL synthesizers with each other to generate correction data for adjusting the phases of the high frequency signals according to the signals compared with each other, and each of the plurality of delay circuits controls the delay according to the correction data. Therefore, in addition to the advantages provided by Embodiment 5, there is provided a further advantage of being able to provide a desired phase difference with a high degree of precision.

While the invention has been described in its preferred embodiments, it is to be understood that an arbitrary combination of two or more of the above-mentioned embodiments can be made, various changes can be made in an arbitrary component in accordance with any one of the above-mentioned embodiments, and an arbitrary component in accordance with any one of the above-mentioned embodiments can be omitted within the scope of the invention.

What is claimed is:

1. A frequency synthesizer comprising:
    a reference oscillator for generating a reference signal;
    a plurality of clock signal, data signal, and load enable signal generating circuits each for generating a clock signal, a data signal, and a load enable signal in synchronization with said reference signal;
    a plurality of shift register circuits each for capturing said data signal on rising edges of said clock signal, and for outputting PLL setting data on a rising edge of said load enable signal;
    a plurality of fractional modulators each for generating dividing number control data on a basis of said PLL setting data in synchronization with said reference signal; and
    a plurality of fractional PLL synthesizers each for generating a high frequency signal according to said PLL setting data, said reference signal, and said dividing number control data, wherein
    said frequency synthesizer controls timing of the load enable signals outputted from said plurality of clock signal, data signal, and load enable signal generating circuits to carry out phase control between the high frequency signals generated by said plurality of fractional PLL synthesizers.

2. The frequency synthesizer according to claim 1, wherein a common clock signal is provided as the plurality of clock signals and a common data signal is provided as the plurality of data signals.

3. The frequency synthesizer according to claim 2, wherein said frequency synthesizer includes a comparator for comparing the high frequency signals outputted from the plurality of fractional PLL synthesizers with each other to generate correction data for adjusting the phases of said high frequency signals according to the signals compared with each other, and said frequency synthesizer generates the data signal and the load enable signals according to the correction data.

4. The frequency synthesizer according to claim 1, wherein said frequency synthesizer includes a comparator for comparing the high frequency signals outputted from the plurality of fractional PLL synthesizers with each other to generate correction data for adjusting the phases of said high frequency signals according to the signals compared with each other, and said frequency synthesizer generates the data signals and the load enable signals according to the correction data.

* * * * *